United States Patent [19]

Halvis

[11] Patent Number: 5,120,960
[45] Date of Patent: Jun. 9, 1992

[54] INFRARED IMAGE DETECTING DEVICE AND METHOD

[75] Inventor: James Halvis, Severna Park, Md.

[73] Assignee: Westinghouse Electric Corp., Pittsburgh, Pa.

[21] Appl. No.: 691,187

[22] Filed: Apr. 25, 1991

[51] Int. Cl.[5] .......................... H01L 25/04; G01J 5/06
[52] U.S. Cl. ................................ 250/338.4; 250/332; 250/349; 250/370.08
[58] Field of Search .............. 250/332, 349, 338.4, 250/370.08, 370.09, 208.1

[56] References Cited

U.S. PATENT DOCUMENTS

| | | | |
|---|---|---|---|
| 4,536,658 | 8/1985 | Ludington | 250/578 |
| 4,651,001 | 3/1987 | Harada et al. | 250/330 |
| 4,659,920 | 4/1987 | Nishiura et al. | 250/211 J |
| 4,661,713 | 4/1987 | Besson et al. | 250/208.1 X |
| 4,675,535 | 6/1987 | Tsunekawa et al. | 250/208.1 |
| 4,939,369 | 7/1990 | Elabd | 250/332 |

FOREIGN PATENT DOCUMENTS 61-275683  12/1986  Japan .............................. 250/370.09

OTHER PUBLICATIONS

"160×244 Element PtSi Schottky-Barrier IR-CCD Image Sensor" by Kosonocky et al., IEEE Trans. on Electron Devices, vol. ED-32, No. 8, Aug. 1985, pp. 1564–1573.

"IrSi Schottky-Barrier Infrared Image Sensor" by Yutani et al., Proceedings of the 1987 International Electron Devices Meeting, IEEE Publication No. CH2515-5/87/0000-0124.

"High Emission Efficiency Iridium Silicide for MWIR Sensors" by Lange et al., Proceedings of the 1989 IRIS Detector Specialty Group Meeting, pp. 257-272.

"A New Concept Silicon Homojunction Infrared Sensor" by Tohyama et al., Proceedings of the 1988 International Electron Devices Meeting.

Primary Examiner—Constantine Hannaher
Attorney, Agent, or Firm—D. G. Maire

[57] ABSTRACT

An infrared (IR) imaging device includes substantially identical top and bottom IR detector arrays. In separate embodiments, either a top or bottom surface of the top array is stacked onto the bottom array to confront a top surface of the bottom array and so that individual detector elements and subarrays of the top array are aligned with corresponding detector elements and subarrays of the bottom array. The image readout circuits of both the top and bottom array are connected by wire bonding to readout control circuits formed in the peripheral region of the wafer in which the bottom array is formed.

31 Claims, 5 Drawing Sheets

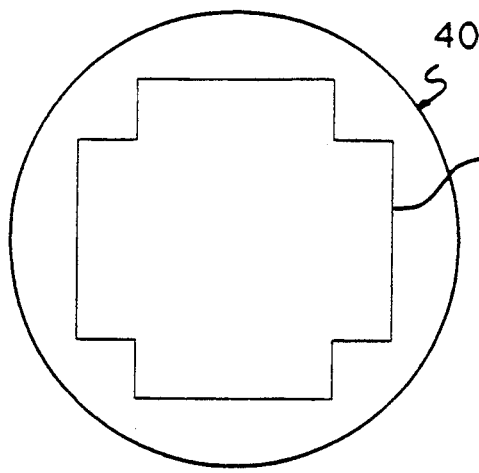
FIG. 8A
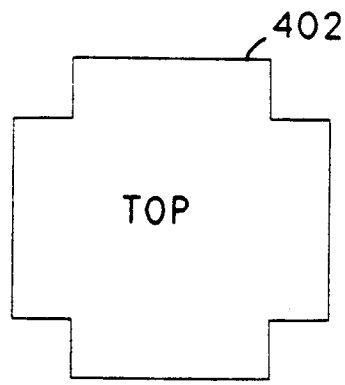
FIG. 8B
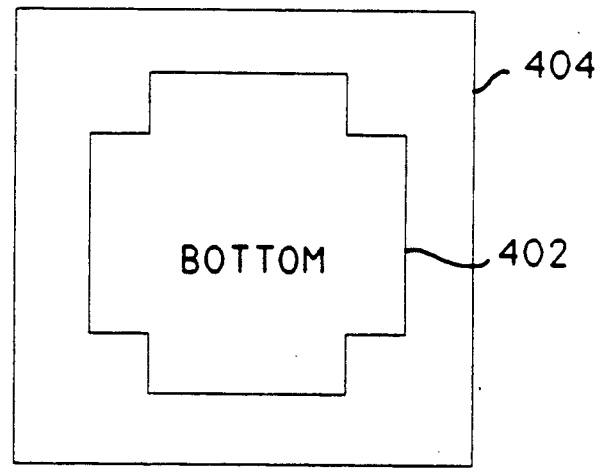
FIG. 8C
FIG. 8D
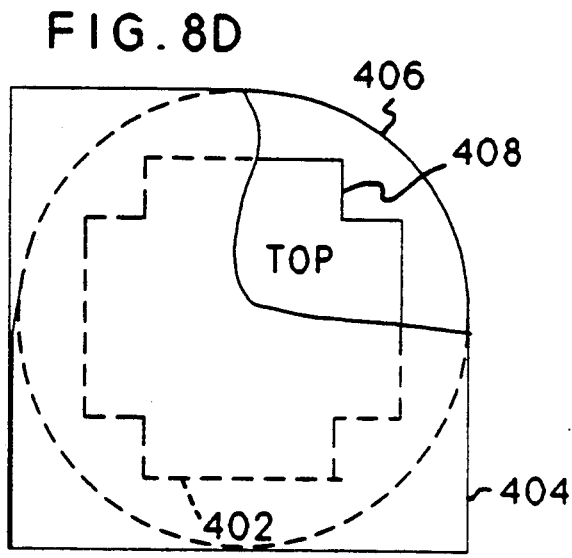
FIG. 8E
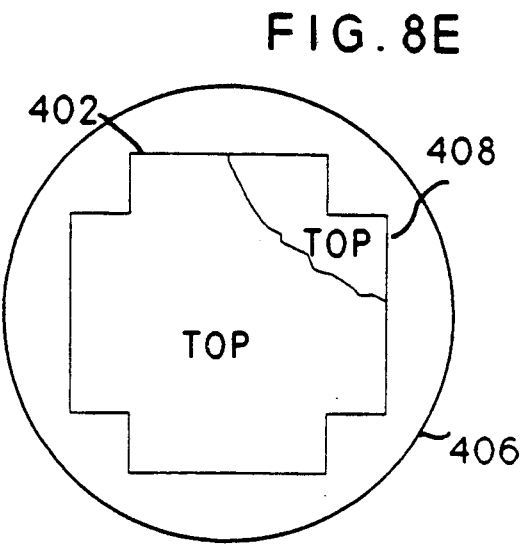

INFRARED IMAGE DETECTING DEVICE AND METHOD

BACKGROUND OF THE INVENTION

The invention relates generally to solid-state image detecting apparatus and, more particularly, to infrared image detecting apparatus including two stacked image detector arrays and methods for making same.

Solid-state image detecting apparatus is well known. Such detecting apparatus includes a plurality of photosensitive image detector elements. In accordance with well known principles, a charge is generated within each detector element as a function of the amount of electromagnetic radiation that is incident thereon. The plurality of detector elements are typically integrated in a semiconductor substrate as either a linear image detector or as an area image detector. The linear image detector includes a narrow line of detector elements that can be used to obtain a two-dimensional image by mechanically scanning the object or scene to be imaged, such as by use of a rotating mirror.

The area image detector is a two-dimensional array of detector elements onto which is projected an image of the object or scene to be imaged. In cases where the two-dimensional array is small, a two-dimensional image can be obtained by a step-and-stare technique, known in the art, in which, by use of additional optical and mechanical means, successive portions of the object or scene to be imaged are projected onto the small array. When the two-dimensional array of detector elements is sufficiently large, the array can be employed as a staring array, such that the entire object or scene to be imaged is projected onto the array. In general, subject to cost considerations, it is desirable to provide a two-dimensional array of detector elements with as large an area as possible in order to simplify and enhance the imaging process.

The spectral band of infrared radiation is generally divided into short (SWIR), middle (MWIR), and long (LWIR) ranges, respectively corresponding to wavelength ranges of 1-3 $\mu$m, 3-5 $\mu$m, and 8-14 $\mu$m. The efficacy of detector elements for one or another of the IR wavelength ranges varies with the composition of the detector elements. For example, MWIR detector arrays with dimensions of 128×128 pixels have been successfully fabricated with InSb and HgCdTe detector elements. The dimensions of 128×128 pixels are relatively small and, depending on the application, would likely be implemented as a step-and-stare array.

Further, LWIR detector arrays having dimensions of 480×4 pixels have been successfully fabricated with HgCdTe detector elements, an array with such dimensions being implemented as a scanning array. Disadvantageously, the production techniques for InSb and HgCdTe detectors are unique and are undergoing further development. Further, the starting materials for such detectors are expensive and the substrates are small. As a result, the fabrication yields of such arrays are very low and their production costs are very high. The difficulties currently encountered in producing functional arrays using such detector compositions necessarily limits the dimensions of the arrays being produced. An advantage of InSb and HgCdTe detectors is their very high quantum efficiency, which is on the order of 70-90%.

Other IR detector compositions are also known. In general, silicide Schottky barrier detectors have been successfully implemented in SWIR, MWIR, and LWIR detector arrays PdSi, PtSi, and IrSi Schottky barrier detectors are examples of such detectors. PtSi Schottky barrier detectors have been successfully implemented in SWIR and MWIR detector arrays. For example, PtSi Schottky barrier cameras having dimensions of 512×512 pixels are commercially available for MWIR applications. Larger arrays of PtSi detector elements, having dimensions on the order of 1024×1024 pixels, are under development. Arrays having such dimensions are typically implemented as staring arrays. An example of image detecting apparatus including PtSi Schottky barrier detector elements, and a method for making same, is described in "160 ×244 Element PtSi Schottky-Barrier IR-CCD Image Sensor" by Kosonocky et al., IEEE Transactions on Electron Devices, Vol. ED-32, No. 8, August 1985, which is incorporated herein by reference.

IrSi Schottky barrier detector arrays have been found to be suitable for LWIR applications. An example of an IrSi Schottky barrier detector array is disclosed in "IrSi Schottky-Barrier Infrared Image Sensor" by N. Yutani et al., Proceedings of the 1987 International Electron Devices Meeting, IEEE Paper No. CH2515-5/87/0000-0124, which is incorporated herein by reference. Characteristics of IrSi detectors implemented for MWIR applications are also described in "High Emission Efficiency Iridium Silicide for MWIR Sensor" by D. Lang et al., Proceedings of the 1989 IRIS Detector Specialty Group Meeting, vol. I, which is incorporated herein by reference.

One advantage of the silicide Schottky barrier detectors is that, generally, they are fabricated on a standard silicon fabrication line using conventional integrated circuit fabrication processes and equipment. The use of conventional fabrication processes contributes to the ability to fabricate arrays having relatively large dimensions, e.g., 512×512 pixels and larger. Further, the use of conventional fabrication processes results in both a reduced cost of fabrication and a higher yield.

A disadvantage of silicide Schottky barrier detectors is their relatively low quantum efficiency, which is on the order of 0.1-3% for PtSi and IrSi detectors, depending on wavelength. Such detectors also have very low optical absorption. However, arrays with such detectors can be constructed to have dimensions sufficiently large to be implemented as staring arrays. As a result, the relatively long integration period permitted in a staring array at least partially compensates for the low quantum efficiency.

A further disadvantage of silicide Schottky barrier detector arrays, and semiconductor devices generally, is that even though they can be produced with relatively large dimensions and acceptable production yields, the production yield decreases as dimensions, such as array dimensions, are further increased or feature sizes are decreased.

A disadvantage shared by all of the above described detector technologies is the difficulty with which redundancy is implemented. In this context, redundancy refers to providing means for compensating for one or more nonfunctioning detector elements. It is noted that a detector element may be rendered nonfunctional not only by defects or failures in the detector element itself, but also by defects or failures in external circuitry coupled to the detector element, e.g., bias or readout circuitry. One redundancy technique known in the art for compensating for a nonfunctioning detector element or elements includes mechanically moving the detector array to sample a pixel of an image by more than one detector element. Thus, disadvantageously, in accordance with this technique, additional mechanical apparatus is required for moving the detector array. In accordance with another known redundancy technique, the outputs of pixels surrounding a nonfunctioning element are averaged or substituted for the nonfunctioning element in order to provide image information corresponding to the nonfunctioning element.

As known in the art, large detector arrays, e.g., 512×512 pixels and larger, are frequently divided into subarrays for the purpose of facilitating the readout of image information. In accordance with such division into subarrays, readout circuitry is separately coupled to the respective subarrays, so that the pixel readout rate can be reduced, thereby reducing noise. While the practice of dividing a detector array into subarrays provides advantages with respect to reading out image information, it results in the disadvantage that a defect or failure incurred in the readout circuitry for a particular subarray likely renders the entire subarray nonfunctional. None of the above described redundancy techniques, or any other prior art techniques of which the inventor is aware, adequately compensates for a nonfunctioning subarray.

It is therefore an object of the present invention to provide an IR image detecting device that is not subject to the aforementioned problems and disadvantages of the prior art.

It is another object of the present invention to provide an IR image detecting device that comprises a large staring array and that can be fabricated with a high production yield.

It is a further object of the present invention to provide an IR image detecting device that incorporates a redundancy technique that compensates for a nonfunctioning subarray.

SUMMARY OF THE INVENTION

Additional advantages of the invention will be set forth in part in the description which follows, and in part will be obvious from the description, or may be learned by practice of the invention. The advantages of the invention may be realized and attained by means of the instrumentalities and combinations particularly pointed out in the appended claims.

The present invention overcomes the problems and disadvantages of the prior art by providing an infrared (IR) imaging device comprising a first detector array including a plurality of internal photoemission IR detector elements arrayed to have a predetermined arrangement and a second detector array including a plurality of internal photoemission IR detector elements arrayed to have the predetermined arrangement. The first and second detector arrays each includes a substrate in which are disposed the plurality of detector elements forming a top surface of the first or second detector array. A surface of the substrate remote from the plurality of detector elements is a bottom surface of the first or second detector array. The first detector array is mounted on the second detector array such that one of the top and bottom surfaces of the first detector array confronts the top surface of the second detector array and each of the plurality of detector elements of the first array is aligned and paired with a corresponding one of the plurality of detector elements of the second array.

Each of the first and second detector arrays includes functional detector elements, among the plurality of detector elements, from which image information can be read out. The IR imaging device also includes readout circuit means, coupled to preselected ones of the functional detector elements of the first and second detector arrays, for reading out image information from at least the preselected one of each pair of corresponding detector elements of the first and second detector arrays.

Further in accordance with the present invention, there is provided a method for making an infrared (IR) imaging device including top and bottom detector arrays each comprising a plurality of internal photoemission IR detector elements arrayed in subarrays to have a predetermined arrangement. Each of the top and bottom detector arrays includes a substrate in which are disposed the plurality of detector elements forming a top surface of the top or bottom detector array, a surface of the substrate remote from the plurality of detector elements being a bottom surface of the top or bottom detector array. The method comprises an initial step of fabricating, to a predetermined point in an array fabrication process, a plurality of substantially identical detector arrays to provide a plurality of partially fabricated detector arrays, the predetermined point corresponding to a degree of completion that enables functional testing of the subarrays of each partially fabricated detector array. Next, each partially fabricated detector array is tested to identify functional ones of the subarrays. Then the partially fabricated detector arrays are matched such that a matched pair of detector arrays includes at least one functional subarray for each subarray of the predetermined arrangement. After matching, the detector arrays of each matched pair of detector arrays are designated as the top and bottom arrays and fabrication of the respective top and bottom detector arrays is completed. The top detector array is then mounted onto the bottom detector such that one of the top and bottom surfaces of the top detector array confronts the top surface of the bottom detector array and each detector element and subarray of the top array is respectively aligned and paired with a corresponding one of the detector elements and subarrays of the bottom array. As a final step, at least one of the functional subarrays of each corresponding pair of subarrays is conductively coupled to image information readout circuitry.

The accompanying drawings which are incorporated in and constitute a part of this specification, illustrate embodiments of the invention and, together with the description, serve to explain the principles of the invention.

BRIEF DESCRIPTION OF THE DRAWINGS

FIGS. 8A-8E illustrate steps of a method for fabricating an imaging device according to the invention.

DESCRIPTION OF THE PREFERRED EMBODIMENT

Reference will now be made in detail to the present preferred embodiment of the invention, an example of which is illustrated in the accompanying drawings. Whenever possible, the same reference numbers will be used throughout the drawings to refer to the same or like parts.

In accordance with the illustrated embodiments of the present invention, there is provided an IR imaging device comprising a first IR detector array stacked on a second IR detector array. The detector elements of each of the first and second IR detector arrays have the same predetermined arrangement so that the individual detector elements and subarrays of the first array are aligned with corresponding elements and subarrays of the second array. The first and second arrays are preferably large staring arrays constructed to include silicide Schottky barrier detector elements having a relatively low optical absorption and a correspondingly relatively high optical transmissivity. A bottom surface of the second array is an incident radiation receiving surface of the imaging device. As a result of the high optical transmissivity of the first array and the alignment of the detector elements and subarrays of the first and second arrays, radiation incident on the imaging device is detected by the corresponding detector elements and subarrays of both arrays. Accordingly, both the first and second detector arrays can be included in the imaging device even if either includes nonfunctioning subarrays or individual detector elements, provided that at least the corresponding subarrays and, optionally, corresponding individual detector elements, of the other array are functional. Then, image information from the functional one of corresponding subarrays and detector elements can be read out. Further, in the event corresponding detector elements of the first and second detector arrays are both functional, the respective image information generated thereby can be read out and summed. As a result, an IR imaging device having a large area and a high production yield is provided.

Figure 1:
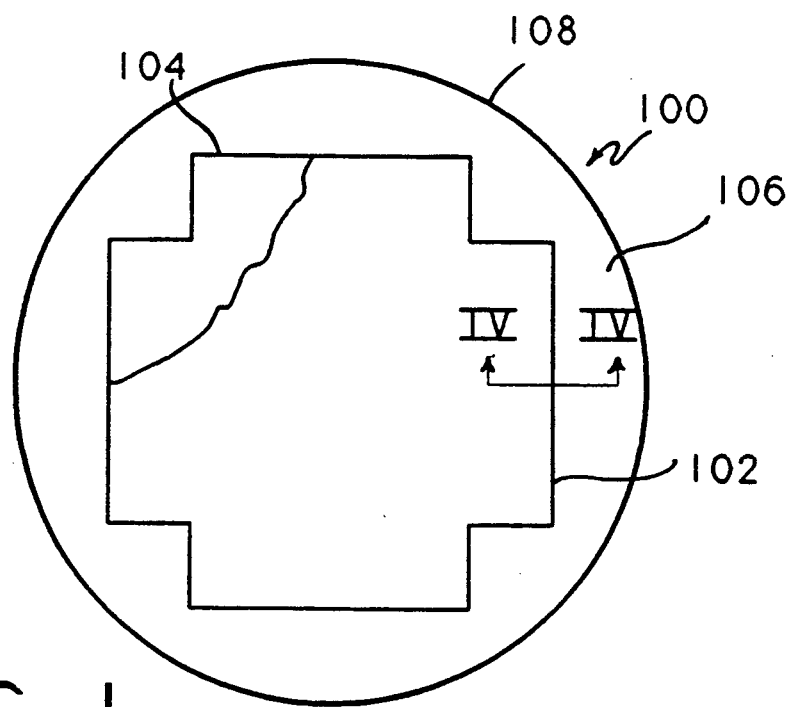
FIG. 1 illustrates an imaging device constructed in accordance with the present invention.

Referring now to the drawings, FIG. 1 illustrates an infrared (IR) imaging device 100 constructed in accordance with the present invention. Device 100 includes a first IR detector array 102 which is stacked on a second IR detector array 104 formed in a wafer 108. Each of detector arrays 102 and 104 comprises a plurality of internal photoemission IR detector elements arrayed to have a predetermined arrangement. A preferred arrangement of the detector elements is described more fully below. As seen in FIG. 1, detector array 102 has a cross-sectional area substantially identical to that of detector array 104, so that with detector array 102 aligned with and mounted on detector array 104, a peripheral region 106 of wafer 108 is not covered by detector array 102.

Figure 2:
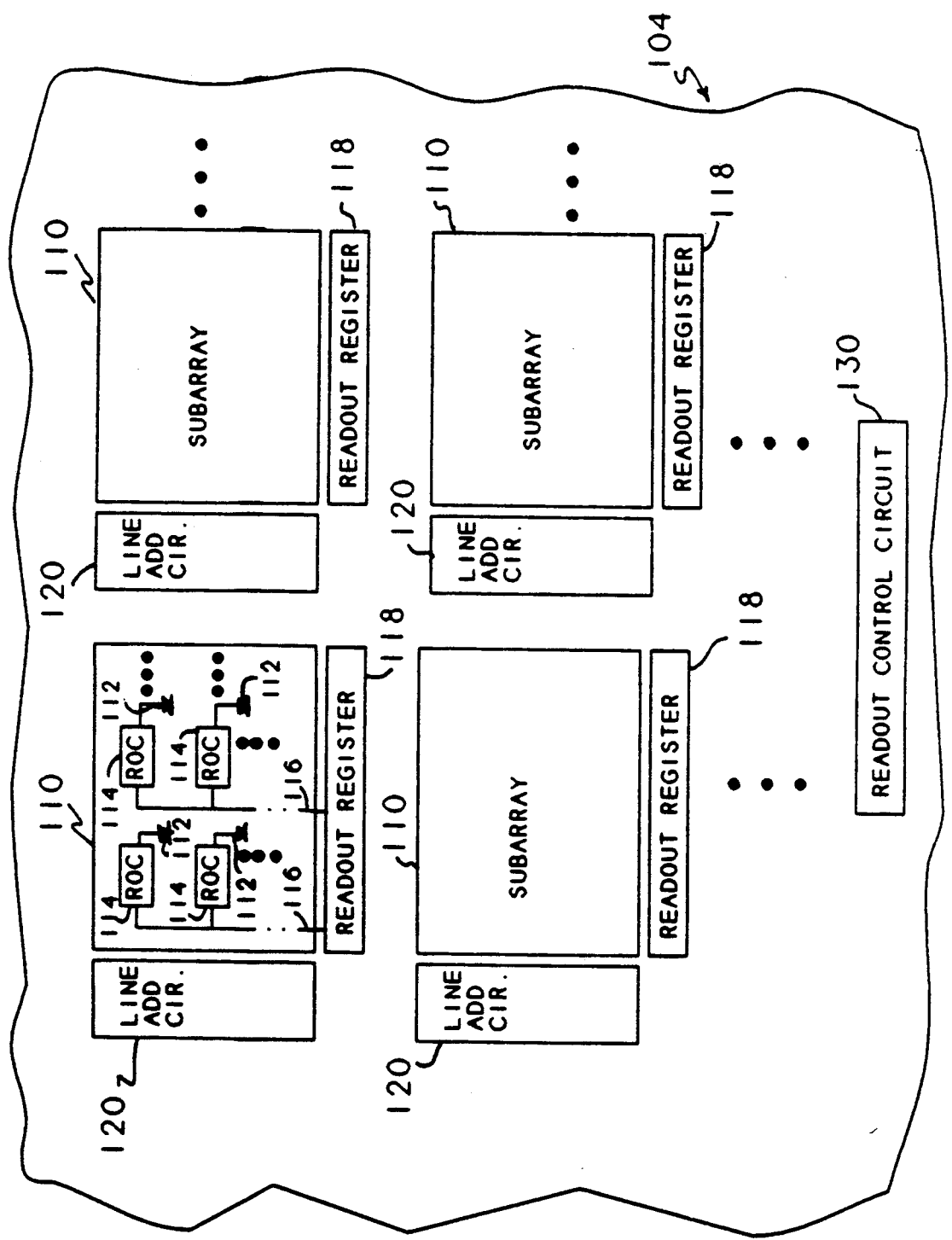
FIG. 2 illustrates an exemplary detector array included in the imaging device shown in FIG. 1.

FIG. 2 illustrates a portion of detector array 104 which includes a plurality of subarrays 110. Each subarray 110 includes individual detector elements 112 arrayed in accordance with the predetermined arrangement. Each detector element 112 is coupled to readout circuitry (ROC) 114, e.g., CMOS switched capacitor readout circuitry, which is well known in the art. Detector elements 112 are arranged in columns. Readout bus lines 116 are respectively associated with the columns of detector elements 112 for transferring image information generated by each detector element 112 to a readout register 118. For simplicity, circuitry required for addressing the individual ROC circuits 114 to read out image information generated by the respective detector elements is only shown diagrammatically as line addressing circuit 120, the nature of such addressing circuitry being well known in the art.

Detector array 104 also includes a readout control circuit 130 which is coupled to readout register 118 and line address circuit 120 of at least one of subarrays 110 to control the reading out of image information. In accordance with practices well known in the art, such control by circuit 130 of the readout of image information includes controlling the sequence in which data is read out from individual detector elements, amplifying the readout image data, and multiplexing for sorting the read out image data. It is preferred herein that a separate readout control circuit be associated with each subarray 110 to control the readout of image data from the associated subarray. It is further preferred herein that each readout control circuit 130 is disposed in peripheral region 106 of detector array 104.

While readout circuitry generally of the type disclosed above, i.e., readout circuits 114, readout registers 118, address circuits 120 and readout control circuits 130, is required for the operation of any detector array, the detailed construction of such circuitry is well known in the art and is not described further herein.

Detector array 102 (FIG. 1) is constructed substantially identically to detector array 104 except that readout control circuits 130 for the subarrays 110 of detector array 102 are preferably disposed in peripheral region 106 of detector array 104. Such identical construction of the detector arrays includes the same predetermined arrangement of detector elements and subarrays in each of arrays 102 and 104. As a result, detector array 102 can be stacked on detector array 104 such that the individual detector elements and subarrays of detector array 102 are aligned and paired with corresponding ones of the detector elements and subarrays of detector array 104.

Figure 3:
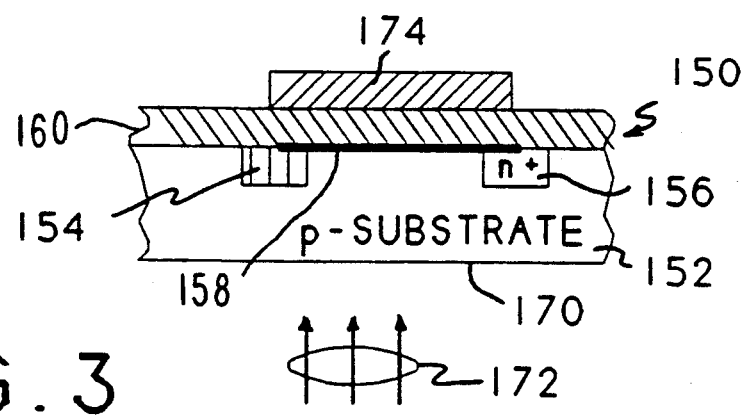
FIG. 3 illustrates an exemplary detector element included in the detector array shown in FIG. 2.

Detector elements 112 of each array 102 and 104 are preferably selected to have a relatively low optical absorption, e.g., on the order of 30% or less, and a correspondingly relatively high optical transmissivity such that a sufficiently large portion of radiation incident on a bottom surface of array 104 passes through the detector elements of array 104 and is detected by corresponding detector elements of array 102. More particularly, it is preferred herein that detector elements 112 of arrays 102 and 104 are provided as silicide Schottky barrier type detectors such as the above described PtSi, PdSi, or IrSi Schottky barrier detectors. FIG. 3 is a simplified cross-sectional view of an exemplary Schottky barrier detector 150 including a p-type silicon substrate 152 in which are disposed a guard ring 154 and a heavily doped n+ region 156 for signal integration. Detector 150 also includes a metallic electrode 158 composed of PtSi, PdSi, or IrSi. An insulating layer 160 of $SiO_2$ is deposited over electrode 158. Means for connecting detector 150 to readout circuit 114 are not shown. A bottom surface 170 of substrate 152 constitutes a radiation receiving surface for receiving incident radiation 172.

Optionally, in accordance with a known technique for improving the efficiency of a photosensitive detecting element and in accordance with a second embodiment of the invention more fully described below, detector 150 when implemented in array 102 can include a layer of aluminum 174 disposed to serve as a reflector to reflect radiation that has passed through electrode 158 so that the radiation can pass through and be detected by electrode 158 a second time. The detector elements of detector array 104 do not include aluminum layer 174.

Referring also to FIG. 2, the individual detector elements 112 of array 102 or 104 are formed in a top surface of the array, while bottom surface 170 of substrate 152 in which detector elements 112 are formed corresponds to a bottom surface of array 102 or 104 for receiving incident radiation 172.

Figure 4A:
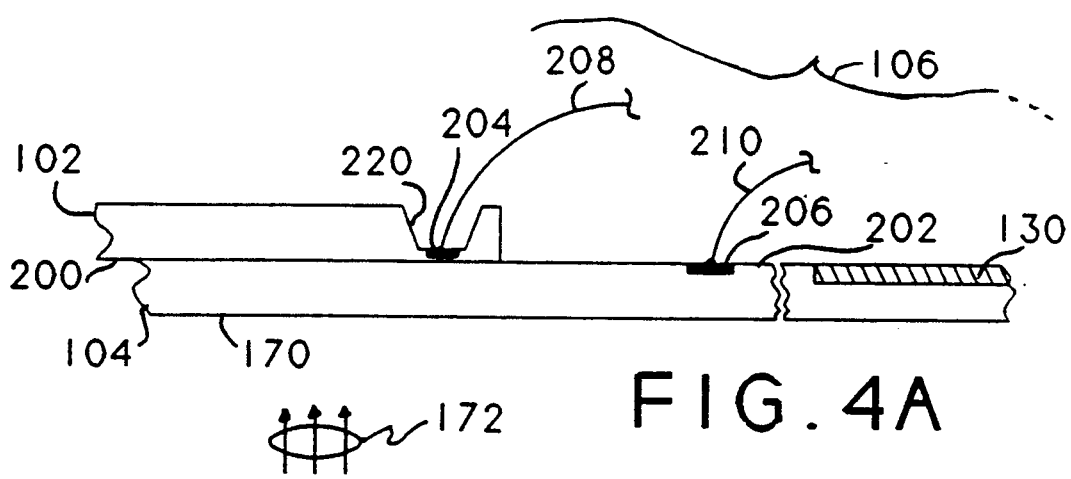
FIGS. 4A-4C illustrate the mounting of detector arrays in accordance with embodiments of the invention.

Referring again to FIG. 1, in accordance with a first embodiment of the invention, the top surface of detector array 102 is stacked onto, i.e., to confront, the top surface of detector array 104. FIG. 4A, which is section IV—IV in FIG. 1, diagrammatically illustrates exemplary connections of readout register 118 and line address circuit 120 (hereafter collectively the array readout circuits) between arrays 102 and 104 and readout control circuits 130, in accordance with a first variation of the first embodiment. As seen in FIG. 4A, a top surface 200 of array 102 is stacked onto a top surface 202 of array 104. As a result, the respective top surfaces of arrays 102 and 104, in which are formed detectors 112 and associated readout circuits, confront each other. Array 102 includes a first set of bonding pads in a metallization layer, proximate top surface 200, which connect, by bus lines not shown, to the array readout circuits. An exemplary bonding pad 204 of the first set of bonding pads is shown in FIG. 4A.

Similarly, array 104 is illustrated in FIG. 4A as including a second set of bonding pads, including an exemplary bonding pad 206, located in peripheral region 106 in a metallization layer proximate top surface 202 and connected, by bus lines not shown, to the array readout circuits of array 104. Connections from the array readout circuits of arrays 102 and 104 to readout control circuits 130 are made by wire bonding with jumper wires from the first and second sets of bonding pads to bonding pads associated with circuits 130, such connections being illustrated in FIG. 4A by the connections of jumper wires 208 and 210 from bonding pads 204 and 206, respectively, to bonding pads (not shown) associated with circuit 130.

In general, arrays 102 and 104 each include features and are constructed in accordance with processes known in the art. Such known features and processes include the formation of multiple layers of metallization for forming electrodes and interconnections in the individual detector elements, forming bus line connections, forming bonding pads, and, optionally, forming reflecting layer 174 of individual detector elements. In the illustrated embodiments, bus line connections are provided from individual detector elements to readout registers 118 and line address circuits 120, from readout registers 118 and line address circuits 120 to bonding pads at the periphery of the array and between each readout control circuit 130 and bonding pads associated therewith. It is therefore understood that the bonding pads and bus lines described herein are included in metallization layers and further reference to such metallization layers is not made.

With respect to the wire bonding of jumper wires to the first set of bonding pads, such as the connection of jumper wire 210 to bonding pad 204, since top surface 200 of array 102 is not directly accessible, such connections are made to the respective back surfaces of the first set of bonding pads through via holes etched through the bottom surface of array 102. An example of such a connection is the connection of jumper wire 208 to the back of bonding pad 204 through a via hole 220. Also, although not explicitly illustrated, in accordance with techniques well known in the art, a layer of insulating material, not shown, such as $SiO_2$, covers the bonding pads of arrays 102 and 104 of each of the embodiments described herein. As a result, the connections of jumper wires to the second set of bonding pads in top surface 202 of array 104 are made through via holes etched in the insulating layer.

In general, wire bonding techniques are well known in the art and the practice of the present invention is not limited to any particular wire bonding technique.

Figure 4B:
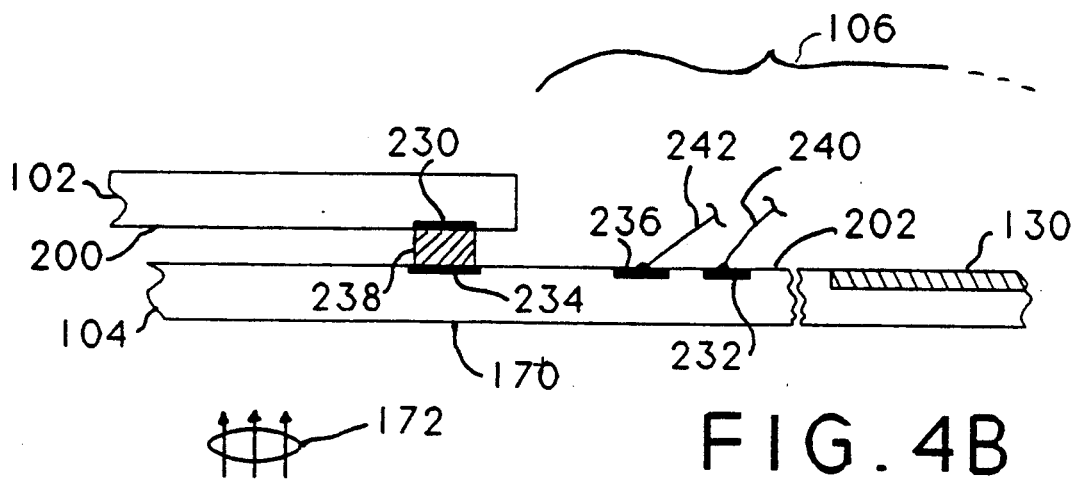

FIG. 4B, which is section IV—IV in FIG. 1, diagrammatically illustrates the connection of the array readout circuits of arrays 102 and 104 to readout circuits 130, in accordance with a second variation of the first embodiment of the invention. As seen in FIG. 4B, top surface 200 of array 102 confronts top surface 202 of array 104. Array 102 includes a first set of bonding pads, proximate top surface 200, which connect, by bus lines not shown, to the array readout circuits of array 102. An exemplary bonding pad 230 of the first set of bonding pads is shown in FIG. 4B.

Array 104 includes a second set of bonding pads, such as exemplary bonding pad 234, formed in top surface 202 of array 104 and aligned to confront corresponding bonding pads of the first set of bonding pads. The second set of bonding pads are conductively connected by bus lines, not shown, to corresponding ones of a third set of bonding pads formed in top surface 202 of array 104 in peripheral region 106. Bonding pad 236 is an exemplary one of the third set of bonding pads and is conductively connected to bonding pad 234 by a bus line, not shown. A fourth set of bonding pads, including an exemplary bonding pad 232, are located in peripheral region 106 and connected, by bus lines not shown, to the array readout circuits of array 104.

In accordance with the second variation of the first embodiment, the first set of bonding pads in top surface 200 of array 102 are conductively connected by bump bonding to corresponding bonding pads of the second set of bonding pads in top surface 202 of array 104. This is illustrated in FIG. 4B by the bump bonding of pads 230 and 234 by an indium bump 238. Bump bonding techniques are well known in the art and the practice of the present invention is not limited to any particular bump bonding technique. The connections of the array readout circuits of arrays 102 and 104 to readout control circuits 130 are completed by wire bonding with jumper wires connected from the third and fourth sets of bonding pads to bonding pads associated with circuits 130, such wire bonding connections being illustrated by exemplary jumper wires 240 and 242 respectively connected from bonding pads 232 and 236 to bonding pads (not shown) associated with circuit 130.

In accordance with a second embodiment of the present invention, the bottom surface of detector array 104 is stacked on the top surface of detector array 102. FIG.

4C is section IV—IV of FIG. 1, diagrammatically illustrates exemplary connections of the array readout circuits of arrays 102 and 104 to readout control circuits 130. In accordance with the second embodiment, array 102 includes a first set of bonding pads, including exemplary bonding pad 300, formed in top surface 200 near the periphery of array 102 and connected by bus lines (not shown), to the array readout circuits of array 102. Array 104 similarly includes a second set of bonding pads, including exemplary bonding pad 302, formed in top surface 202 in peripheral region 106 and connected by bus lines (not shown) to the array readout circuits of array 104.

Figure 4C:
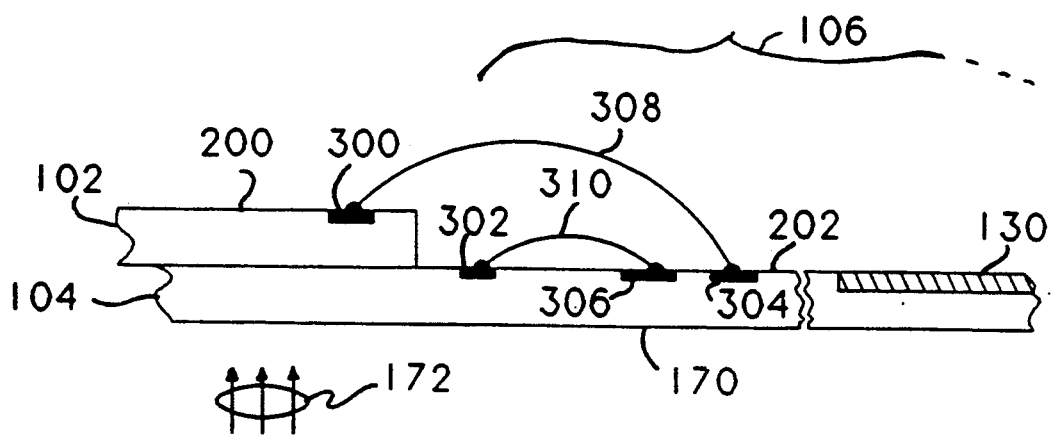

Also shown in FIG. 4C are bonding pads, including exemplary bonding pads 304 and 306, that are associated with and connected by bus lines (now shown) to readout control circuits 130.

In order to conductively connect the array readout circuits of arrays 102 and 104 to readout control circuits 130, the first and second sets of bonding pads are wire bonded to the bonding pads associated with readout control circuits 130 by jumper wires. This is illustrated in FIG. 4C by the exemplary wire bonding of bonding pads 300 and 302 to bonding pads 304 and 306, associated with readout circuits 130, by wire jumpers 308 and 310.

It is preferred herein that the second embodiment of the invention be practiced with detector elements 150 of array 104 that include aluminum layer 174. As a result, radiation 172 incident on bottom surface 170 of array 104 passes through and is detected first by the detector elements of array 104 and then by the detector elements of array 102. Then the radiation is reflected by aluminum layer 174 such that it passes through and is detected a second time by the detectors of array 102 and then the detectors of array 104.

While FIGS. 4A to 4C illustrate separate connections between each of arrays 102 and 104 and readout control circuits 130, those skilled in the art will now recognize that other types of conductive connections, as may have utility in imaging applications, can be made in an analogous manner. For example, it may be desired to read out image data from arrays 102 and 104 in accordance with a common clock signal. In such a case, simultaneous application of a common clock signal to both arrays 102 and 104 would be desirable and readily effected by connecting together respective bonding pads of arrays 102 and 104 that correspond to clock signal inputs. As an example, this can be accomplished in the arrangement illustrated in FIG. 4B, assuming that bonding pads 236 and 232 respectively correspond to a clock signal input for arrays 102 and 104, by the wire bonding of bonding pads 232 and 236 together with one jumper wire and only providing one or the other of jumper wires 240 and 242 for connection to a clock signal source of control circuit 130.

Figure 5:
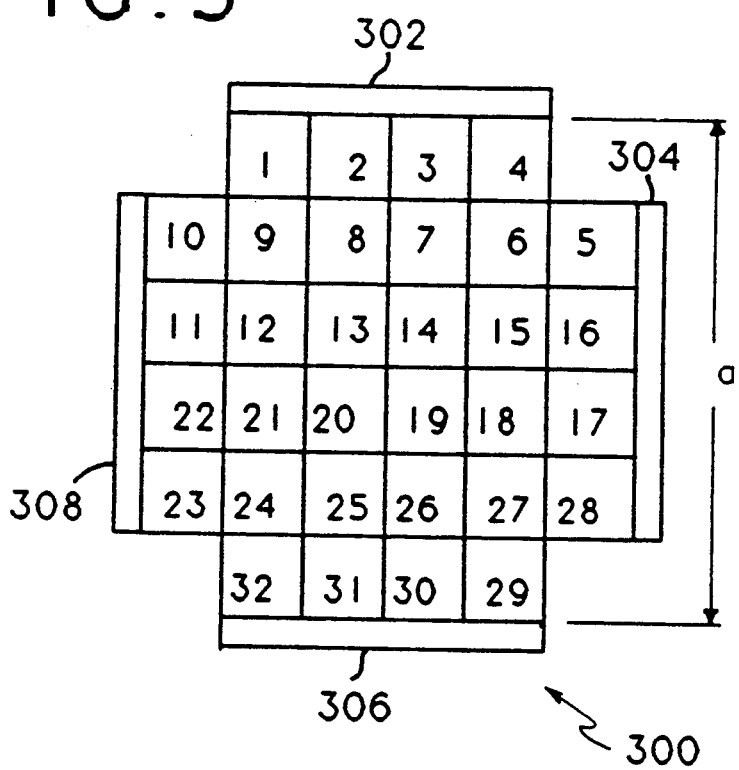
FIG. 5 illustrates a preferred arrangement of subarrays of a detector array included in the imaging device shown in FIG. 1.

FIG. 5 diagrammatically illustrates a preferred arrangement 300 of subarrays 110 of arrays 102 or 104. In accordance with the preferred arrangement, each of arrays 102 and 104 include thirty-two subarrays 110 which, in FIG. 5, are respectively numbered 1–32 for convenience. The individual detector elements and associated readout circuits within all subarrays of both arrays 102 and 104 are also arrayed to have fixed predetermined dimensions and spacings so that arrays 102 and 104 can be stacked and aligned as described above. Without limitation, in accordance with an exemplary arrangement of detector elements, assuming the use of any of the above noted silicide Schottky barrier detector elements, each detector element occupies an area of approximately 0.0015 inches (0.0038 cm) by 0.0015 inches (0.0038 cm) and each subarray has dimensions of 256×256 detector elements. Further, respective subarrays are spaced apart by approximately 0.0030 inches (0.0076 cm). As a result, an overall side dimension "a" (FIG. 5) of arrangement 300· is approximately 2.319 inches (5.890 cm).

It is noted that FIG. 5 is diagrammatic and, in the case of array 102 which has the shape shown in FIGS. 1 and 5, the extent of a wafer in which the array is disposed does not end precisely at the boundaries of the subarrays. For example, as more fully described below, the bonding pads associated with each subarray are preferably formed in peripheral regions of the array immediately adjacent the subarrays. This is illustrated in FIG. 5 by peripheral regions 302, 304, 306, and 308 in which bonding pads are formed, these peripheral regions 302–308 being located along the respective edges of the array and are part of the same wafer in which the array is formed. In an array constructed to have the exemplary dimensions described above. each peripheral region 302–308 can have a width of approximately 0.020 inches (0.051 cm).

Still referring to FIG. 5, the preferred subarray arrangement 300 is symmetric such that array 102 can be mounted on array 104 in any of four different relative orientations by rotating array 102 through 90° increments. For example, assuming array 104 is held stationary with the orientation shown in FIG. 5, array 102 can be mounted thereon with any of the following four groups of subarrays respectively aligned with subarrays 1–4 of array 104: subarrays 1–4, subarrays 5, 16, 17 and 28, subarrays 29–32, or subarrays 23, 22, 11 and 10.

The ability to mount arrays 102 and 104 with four different possible relative orientations, results in an increased production yield of imaging device 100. As described above, the stacking of arrays 102 and 104 enables the use of arrays containing nonfunctioning detector elements and subarrays. The multiple possible relative orientations of the two arrays provides greater flexibility in selecting two wafers that can be stacked such that at least one of the arrays has a functioning subarray corresponding to each of the thirty-two subarray locations.

Figure 6:
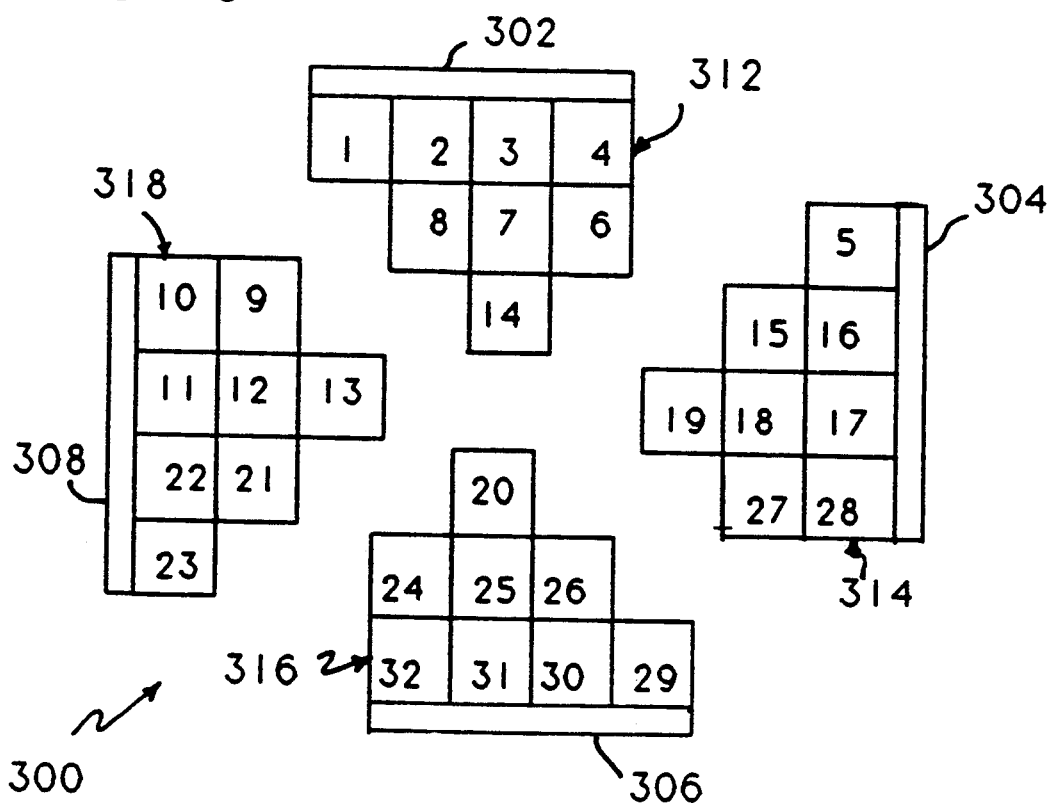
FIG. 6 illustrates a definition of quadrants of the preferred arrangements of subarrays shown in FIG. 5.

With respect to preferred subarray arrangement 300, it is further preferred herein that the arrangement of thirty-two subarrays be defined as consisting of four quadrants. FIG. 6 illustrates an exploded view of preferred arrangement 300 in which that arrangement is defined as consisting of quadrants 312, 314, 316 and 318. The primary purpose of defining the four quadrants is to segregate the above-described bus line interconnections to bonding pads associated with the subarrays of one quadrant from those of the other quadrants. In particular, the bonding pads of each subarray, that are connected to the array readout circuitry, are preferably located in the peripheral regions proximate the periphery of the subarray quadrant with which they are associated. Accordingly, as shown in FIG. 6, the bonding pads formed in peripheral regions 302, 304, 306, and 308 are respectively only connected to the subarrays of quadrants 312, 314, 316, and 318.

Figure 7:
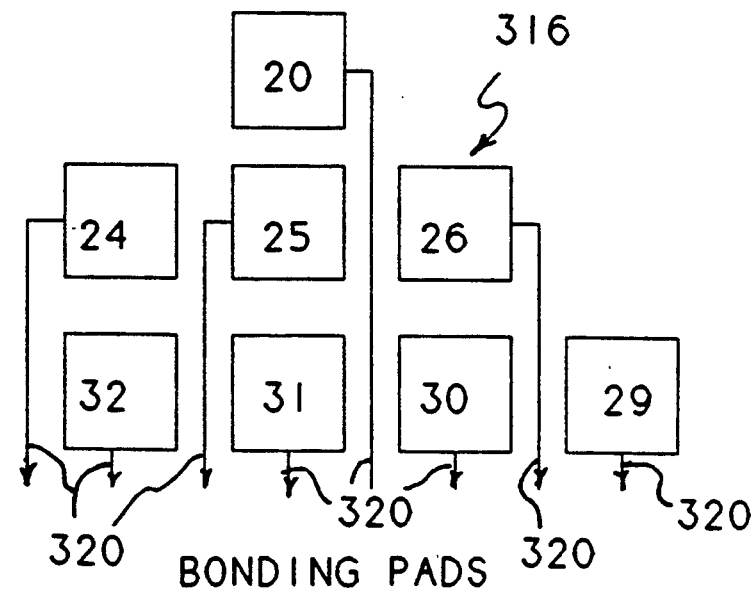
FIG. 7 illustrates bus line connections to the subarrays of one of the quadrants shown in FIG. 6.

FIG. 7 illustrates exemplary bus line connections 320, for quadrant 316, to the bonding pads formed in peripheral region 306 and associated with the subarrays of quadrant 316. As noted above, a predetermined spacing can be provided between adjacent subarrays. Such spacing between adjacent subarrays serves as an area through which bus line connections 320 can be routed. With respect to the above described exemplary spacing of 0.0030 inches (0.0076 cm) between subarrays, if metal bus lines having an individual width of 1.25 microns and a pitch of 2.5 microns are formed, then at least twenty-five bus lines can readily be routed in parallel between adjacent subarrays in a single metallization level.

In the operation of device 100, IR radiation 172 incident on bottom surface 170 of the device is detected by the functional detector elements of detector array 104 and then by the functional detector elements of detector array 102. Image data is read out to readout control circuits from the detector elements of at least a functional one of each corresponding pair of subarrays. In the case where corresponding subarrays are both functional, the readout control circuit can be operated to sum the image information generated by corresponding detector elements.

A method for constructing imaging device 100 in accordance with the present invention is described next. As an initial step, multiple imaging arrays similar to array 104, including readout control circuits on the periphery thereof, are each fabricated, on a separate semiconductor wafer, to a predetermined point in the fabrication process. The predetermined point in the fabrication process corresponds to the deposition of a level of metallization sufficient to enable the functional testing of, at least, the subarrays of the array. The arrays are then subjected to such functional testing which, as a minimum, tests the functionality of the individual subarrays and, if desired, can include testing to a level that identifies the functionality of individual detector elements. As a result of this testing, the functional status of each subarray and, if tested, each detector element, is recorded.

Also, as part of the testing step, optionally, readout control circuits 130 formed in the periphery of each wafer can also be tested. However, it is preferred herein that the number of readout circuits 130 formed in the wafer be two or more times the required number, in order to assure an adequate number of functional circuits. Then, subsequent to mounting the array 102 onto array 104, the individual functional readout circuits can be identified by testing and wire bonded to the bonding pads associated with different subarrays, as described above.

Having identified functional subarrays and, if desired, functional detector elements, the various partially fabricated arrays are matched into pairs such that, as described above, one array can be stacked onto another in a manner to provide at least one functional subarray for each of the subarrays of the predetermined arrangement. Thus, with respect to preferred subarray arrangement 300 (FIG. 5), the various partially fabricated arrays are matched such that a pair of matched arrays can be stacked to provide at least one functional subarray for each of the thirty-two subarrays. Optionally, the arrays can be further matched to provide a functional detector element for every image pixel location. However, it is not a requirement of the invention that a functional detector element be provided for every pixel location. Since, as noted above, the multiple possible relative orientations of two arrays provides greater flexibility in successfully matching two arrays, the overall production yield of imaging device 100 is improved.

After completion of the matching of arrays, the arrays of each matched pair are designated top and bottom with respect to stacking. Although not essential, it is preferred herein that the array having the greater number of functional subarrays be designated as the bottom array, i.e., the array subjected to incident radiation. This is preferred because incident radiation will be attenuated by the bottom array before being detected by the top array. As a result, the incident radiation can be more efficiently detected by providing the array with the greatest number of functional subarrays as the bottom array.

Once the wafers are identified as containing top or bottom arrays, the remaining fabrication of the individual arrays is completed. It is preferred herein that the steps required to complete fabrication of the individual arrays include a step of forming the bonding pads at the periphery of each array. It is further preferred that bonding pads be formed for detector elements or subarrays determined to be nonfunctional during the above described testing, so that custom masking is not required for the formation of bonding pads. Of course, such bonding pads would not be connected to the readout control circuits.

With respect to the second embodiment of the invention, the completion of fabrication of individual arrays identified as top arrays would preferably include a final metallization layer that contains a reflecting layer, such as aluminum layer 174 (FIG. 3) described above, for each detector element in the top array.

The remaining steps of the method are described with reference to FIGS. 8A-8E, with respect to which it is assumed that each wafer includes the above-described preferred arrangement 300. FIG. 8A illustrates a completely fabricated wafer 400 that has been identified as containing a top array 402. As seen in FIG. 8B, the wafer is sawed to remove the periphery containing readout circuits 130 and leaves substantially only the subarrays and peripheral regions proximate the subarrays in which are formed the bonding pads associated with each quadrant of subarrays.

An optional step in which the substrate of top array 402 is thinned can be performed next. As known in the art, thinning is a process by which the thickness of a substrate is reduced by either chemical or mechanical means. With respect to both the first and second embodiments of the invention, thinning is desirable since it enhances the ability to align the top and bottom arrays during a subsequent array mounting step. However, it is further preferred that thinning of the substrate of the top array be performed during construction of imaging device 100 in accordance with the second embodiment, since such thinning results in the bottom surface of the top array being optically flat. Providing the top array with an optically flat bottom surface is desirable in the second embodiment since that bottom surface is mounted in contact with the top surface of the bottom array.

FIG. 8C illustrates the mounting of the sawed top array 402, top-side-down onto a transparent mounting plate 404, e.g., of glass or sapphire, so that the bottom surface of array 402 is exposed and can be subjected to thinning. Array 402 is mounted onto plate 404, such as by mounting in a manner that enables its later removal therefrom with a wax material.

A wafer containing an array designated a bottom array and matched with top array 402 is separately subjected to a polishing process in which the bottom surface of the bottom array is polished smooth, e.g., by mechanical and chemical polishing techniques. As noted above, the bottom surface of the bottom array is a radiation receiving surface of imaging device 100. The bottom surface of the bottom array is polished smooth in order to minimize the scattering of incident radiation at the bottom surface, since such scattering would result in undesirable cross-talk.

After thinning of top array 402 is completed and assuming the bottom surface of the bottom array has been polished, the top array is mounted on the bottom array. Such mounting in accordance with the second embodiment of the present invention is diagrammatically illustrated in FIG. 8D in which mounting plate 404 is turned over and onto a bottom wafer 406 containing a bottom array 408, so that the bottom surface of top array 402 is aligned with and stacked onto a top surface of bottom array 408. It is preferred herein that the required alignment of arrays 402 and 408 be achieved by including one or more alignment markers at identical locations in the two arrays. Array 402, mounted on plate 404, and array 408 are mechanically supported so that the planes of their respective faces are parallel, one of the arrays is held fixed, the position of the other array is adjustable, and one of the two arrays can be moved along an axis perpendicular to the array face plane to bring the arrays into mounting contact. Next, an IR beam is directed to pass first through an alignment marker of the fixed array and then through the other array. The point of impingement of the IR beam onto the other array is detected with an IR camera and the position of that array is adjusted until the beam passes through the appropriate alignment marker. Continuing this adjustment process with one or more additional alignment markers achieves relative alignment of arrays 402 and 408. Top array 402 can then be mounted on bottom array 408. It is noted that in order to successfully effect this mounting technique, mounting plate 404 need only be transparent to IR radiation. During the mounting of top array 402 onto bottom array 408, a thin layer of IR transparent epoxy is introduced between the arrays to bond them together.

In accordance with an alternate mounting technique, mounting plate 404 is provided to include alignment markers in a peripheral region thereof and array 402 is mounted onto plate 404 in alignment with those markers. Further, bottom wafer 406 is provided to include alignment markers, on its periphery, corresponding to the markers on plate 404 and top array 408 is fabricated in alignment with those markers such that it has the same orientation as array 402 relative to the markers on plate 404. The arrays are mechanically supported in the manner described above. Then the alignment of a marker on plate 404 is visibly aligned, by sighting through plate 404 from the side of plate 404 not confronting the bottom array, with a corresponding marker on the periphery of wafer 406. Continuing this adjustment process with one or more additional alignment markers achieves relative alignment of arrays 402 and 408.

Next, as illustrated in FIG. 8E, mounting plate 404 is removed leaving array 408 mounted on array 402.

With respect to the step of mounting the top array onto the bottom array in accordance with the first embodiment of the invention, it is first necessary to remove top array 402 from mounting plate 404 following completion of the optional thinning step. Top array 402 is then mounted onto and in alignment with the bottom array with the respective top surfaces for the top and bottom arrays confronting each other. In accordance with the first variation of the first embodiment, the respective top surfaces are bonded together with a thin layer of IR transparent epoxy. In accordance with the second variation of the first embodiment, as described above, the respective top surfaces are bump bonded together. Alignment of the arrays is preferably achieved by the preferred mounting technique described above with respect to the second embodiment.

Following the bonding together of the top and bottom arrays, the array readout circuitry of the arrays is connected to functional ones of readout control circuits 130 formed in the periphery of the wafer in which the bottom array is formed. Readout control circuits 130 are preferably distributed around the entire periphery of the wafer so that the physical length of connections between the subarrays and the readout control circuits can be minimized.

While the embodiments of the invention have been described as including readout circuitry including CMOS switched capacitor readout circuitry, the invention can be constructed and practiced with equal effectiveness using other known types of readout circuitry, e.g., charge-coupled device (CCD) readout circuitry such as disclosed in the above-incorporated IEEE paper by Kosonocky et al. Further, while the above-described readout circuitry suggests a particular physical arrangement of such circuitry, the present invention is not limited to such an arrangement. As noted above, in accordance with a set of exemplary dimensions for an array, a significant space can be provided between adjacent subarrays. While such space is available for routing bus lines, a portion of this space can be utilized for formation of readout control circuitry required for reading out image information. For example, a CMOS shift register for row addressing can be formed in the space between subarrays.

While the preferred practice of the present invention has been described with respect to the use of silicide Schottky barrier detector elements, the invention is not so limited. The invention can be successfully practiced with any IR detector elements that can be fabricated in a two-dimensional array preferably sufficiently large to be implemented as a staring array and that has a limited quantum efficiency such that radiation can be suitably detected by the top array stacked on the bottom array, wherein the bottom array receives the incident radiation. For example, the invention can be successfully practiced with detectors of the free carrier absorption type, an exemplary type of such detector being described in "A New Concept Silicon Homojunction Infrared Sensor" by Tohyama et al., Proceedings of the 1988 International Electron Devices Meeting. Such free carrier absorption type detector elements have a quantum efficiency of up to a few percent and may have a low optical absorption.

Wire bonding to the readout control circuits is preferred herein because it affords the flexibility of postponing such connections until the end of the fabrication process, so that functional detector elements and subarrays can be wire bonded to functional readout control circuits. However, the invention is not so limited. Connections between the bottom array and the readout circuits on the same wafer can be provided as bus lines formed during the fabrication process of the wafer containing the bottom array. Further, such bus line connections can be formed to couple each array function to multiple readout circuits. Then, in a final fabrication step, after the functional ones of the detector elements, subarrays, and readout control circuits have been identified, the bus line connections to nonfunctional elements can be opened, such as by vaporization with a laser beam or by switches that are selectively opened by logic circuitry.

While the illustrated embodiments of the present invention are directed to an IR imaging device including two detector arrays, the invention includes in its scope an IR imaging device comprising more than two detector arrays in a stacked arrangement to detect incident radiation.

Thus, it is intended that the present invention cover the modifications and the variations of this invention provided they come within the scope of the appended claims and their equivalents.

I claim:

1. An infrared (IR) imaging device, comprising:
   a first detector array including a plurality of internal photoemission IR detector elements arrayed to have a predetermined arrangement;
   a second detector array including a plurality of internal photoemission IR detector elements arrayed to have said predetermined arrangement;
   said first and second detector arrays each including a substrate in which are disposed said plurality of detector elements forming a top surface of said first or second detector array, a surface of said substrate remote from said plurality of detector elements being a bottom surface of said first or second detector array;
   said first detector array mounted on said second detector array such that one of the top and bottom surfaces of said first detector array confronts the top surface of said second detector array and each of said plurality of detector elements of said first array is aligned and paired with a corresponding one of said plurality of detector elements of said second array;
   each of said first and second detector arrays including functional detector elements, among said plurality of detector elements, from which image information can be read out; and
   read-out circuit means, coupled to preselected ones of the functional detector elements of said first and second detector arrays, for reading out image information from at least one preselected functional detector element of each pair of corresponding detector elements of said first and second detector arrays.

2. The IR imaging device of claim 1 wherein the top surface of said first detector array confronts the top surface of said second detector array.

3. The IR imaging device of claim 2, further including:
   first electrical contact means, disposed in the top surface of said first detector array, for coupling to the preselected functional detector elements of said first array;
   the top surface of said second detector array including a peripheral region extending beyond a portion of the top surface of said second detector array covered by said first detector array;
   second electrical contact means, disposed in the top surface of said peripheral region, for coupling to said readout means; and
   means for conductively coupling together said first and second electrical contact means.

4. The IR imaging device of claim 3 wherein said conductive coupling means is a jumper wire.

5. The IR imaging device of claim 3 further including third electrical contact means, disposed in the top surface of said peripheral region, for coupling to the preselected functional detector elements of said second array; and
   means for conductively coupling together said second and third electrical contact means.

6. The IR imaging device of claim 3 wherein said first contact means comprises a first set of bonding pads;
   a second set of bonding pads disposed in the top surface of said second detector array in alignment with and confronting corresponding ones of said first set of bonding pads;
   said second contact means comprising a third set of bonding pads;
   said second set of bonding pads respectively conductively coupled to corresponding ones of said third set of bonding pads; and
   bump bonding means, disposed between said first and second sets of bonding pads, for conductively coupling the corresponding ones of said first and second sets of bonding pads.

7. The IR imaging device of claim 3 wherein the bottom surface of said second detector array is polished and is a radiation receiving surface of said IR imaging device.

8. The IR imaging device of claim 2 wherein each said internal photoemission IR detector element is a Schottky barrier type IR detector comprising a silicon compound.

9. The IR imaging device of claim 2 wherein each of said plurality of detector elements of said first and second detector arrays is a Schottky barrier type IR detector comprising IrSi or PtSi.

10. The IR imaging device of claim 2 wherein each of said plurality of detector elements of said first and second detector arrays is a free carrier absorption type IR detector comprising silicon or a silicon compound.

11. The IR imaging device of claim 1, wherein said predetermined arrangement includes each of said first and second detector arrays being arranged as a set of subarrays, each subarray of said first detector array being aligned with and paired with a corresponding one of the subarrays of said second detector array.

12. The IR imaging device of claim 11, wherein said set of subarrays are symmetrically disposed such that said first detector array can be oriented at least two different ways to align with said second detector array.

13. The IR imaging device of claim 12, wherein said first detector array can be oriented four different ways to align with said second detector array.

14. The IR imaging device of claim 11, wherein ones of said subarrays of said first and second detector arrays are predetermined to be functional subarrays; and
   said read-out means being coupled to preselected ones of the active subarrays for reading out image information from at least one preselected functional subarray of each pair of corresponding subarrays of said first and second detector arrays.

15. The IR imaging device of claim 1 wherein the bottom surface of said first detector array confronts the top surface of said second detector array.

16. The IR imaging device of claim 15, further including:

first electrical contact means, disposed in the top surface of said first detector array, for coupling to the functional detector elements of said first array;

the top surface of said second detector array including a peripheral region extending beyond a portion of the top surface of said second detector array covered by said first detector array;

second electrical contact means, disposed in the top surface of said peripheral region, for coupling to said readout means; and means for conductively coupling together said first and second electrical contact means.

17. The IR imaging device of claim 16 wherein said conductive coupling means is a jumper wire.

18. The IR imaging device of claim 16 further including third electrical contact means, disposed in the top surface of said peripheral region, for coupling to the preselected functional detector elements of said second array; and means for conductively coupling together said second and third electrical contact means.

19. The IR imaging device of claim 15 wherein the bottom surface of said first detector array is thinned so that said first detector array has a predetermined thickness.

20. The IR imaging device of claim 15 wherein the bottom surface of said second detector array is polished and is a radiation receiving surface of said IR imaging device; and wherein each detector element of said first detector array includes reflecting means, remote from a radiation receiving side of said detector element, for reflecting radiation after passage through said detector element.

21. The IR imaging device of claim 15 wherein each said internal photoemission IR detector element is a Schottky barrier type IR detector comprising a silicon compound.

22. The IR imaging device of claim 15 wherein each of said plurality of detector elements of said first and second detector arrays is a Schottky barrier type IR detector comprising IrSi or PtSi.

23. The IR imaging device of claim 15 wherein each of said plurality of detector elements of said first and second detector arrays is a free carrier absorption type IR detector comprising silicon or a silicon compound.

24. A method for making an infrared (IR) imaging device including top and bottom detector arrays each comprising a plurality of internal photoemission IR detector elements arrayed in subarrays to have a predetermined arrangement, each of said top and bottom detector arrays including a substrate in which are disposed said plurality of detector elements forming a top surface of said top or bottom detector array, a surface of said substrate remote from said plurality of detector elements being a bottom surface of said top or bottom detector array, said method comprising the steps of:

fabricating, to a predetermined point in an array fabrication process, a plurality of substantially identical detector arrays to provide a plurality of partially fabricated detector arrays, said predetermined point corresponding to a degree of completion that enables functional testing of the subarrays of each partially fabricated detector array;

testing each partially fabricated detector array to identify functional ones of said subarrays;

matching the partially fabricated detector arrays such that a matched pair of detector arrays includes at least one functional subarray for each subarray of the predetermined arrangement;

designating the detector arrays of each matched pair of detector arrays as the top and bottom arrays;

completing fabrication of the respective top and bottom detector arrays;

mounting the top detector array onto the bottom detector such that one of the top and bottom surfaces of said top detector array confronts the top surface of said bottom detector array and each detector element and subarray of said top array is respectively aligned and paired with a corresponding one of said detector elements and subarrays of said bottom array; and coupling at least one of the functional subarrays of each corresponding pair of subarrays to image information readout circuitry.

25. The method of claim 24 wherein the mounting step comprises the step of mounting the top surface of the top array to confront the top surface of the bottom array.

26. The method of claim 25 wherein the bottom surface of the bottom array is a radiation receiving surface of said IR imaging device; and said method including the further step of polishing the bottom surface of the bottom array.

27. The method of claim 24 wherein the mounting step comprises the step of mounting the bottom surface of the top array to confront the top surface of the bottom array.

28. The method of claim 27 wherein the bottom surface of the bottom array is a radiation receiving surface of said IR imaging device;

said method comprising the further steps of: thinning the substrate of said top array; and polishing the bottom surface of said bottom array.

29. The method of claim 27 wherein the mounting step comprises the substep of bonding with epoxy the bottom surface of said top array to the top surface of said bottom array.

30. The method of claim 24 wherein the fabricating step comprises fabricating each of said substantially identical detector arrays in a respective wafer including a peripheral region surrounding the detector array, said image information readout circuitry being disposed in the peripheral region; and said method including the further step, prior to the mounting step, of cutting the peripheral region away from the top detector array.

31. An infrared (IR) imaging device, comprising:

a first detector array including a plurality of silicide Schottky barrier type IR detector elements arrayed to have a predetermined arrangement;

a second detector array including a plurality of silicide Schottky barrier type IR detector elements arrayed to have said predetermined arrangement;

said first and second detector arrays each including a substrate in which are disposed said plurality of detector elements forming a top surface of said first or second detector array, a surface of said substrate remote from said plurality of detector elements being a bottom surface of said first or second detector array, the bottom surface of said first detector array being thinned so that said first detector array has a predetermined thickness;

said first detector array mounted on said second detector array such that the bottom surface of said first detector array confronts the top surface of said second detector array and each of said plurality of detector elements of said first array is aligned and paired with a corresponding one of said plurality of detector elements of said second array;

each of said first and second detector arrays including functional detector elements, among said plurality of detector elements, from which image information can be read out;

read-out circuit means, coupled to preselected ones of the functional detector elements of said first and second detector arrays, for reading out image information from at least one preselected functional detector element of each pair of corresponding detector elements of said first and second detector arrays;

first electrical contact means, disposed in the top surface of said first detector array, for coupling to the functional detector elements of said first array;

the top surface of said second detector array including a peripheral region extending beyond a portion of the top surface of said second detector array covered by said first detector array;

second electrical contact means, disposed in the top surface of said peripheral region, for coupling to said readout means;

third electrical contact means, disposed in the top surface of said peripheral region, for coupling to the preselected functional detector elements of said second array; and means for conductively coupling together said first and second electrical contact means and for conductively coupling together said second and third electrical contact means.

* * * * *